United States Patent
Tanaka et al.

(10) Patent No.: US 9,324,558 B2
(45) Date of Patent: Apr. 26, 2016

(54) MACHINING PROCESS FOR SEMICONDUCTOR WAFER

(71) Applicant: SUMCO CORPORATION, Tokyo (JP)

(72) Inventors: Toshiyuki Tanaka, Takeo (JP);
Yasuyuki Hashimoto, Karatsu (JP);
Tomohiro Hashii, Imari (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 14/310,643

(22) Filed: Jun. 20, 2014

(65) Prior Publication Data
US 2015/0004799 A1 Jan. 1, 2015

(30) Foreign Application Priority Data

Jun. 26, 2013 (JP) ................................. 2013-133386

(51) Int. Cl.
H01L 21/302 (2006.01)
H01L 21/02 (2006.01)
B24B 37/04 (2012.01)
B24B 1/00 (2006.01)
B24B 7/22 (2006.01)

(52) U.S. Cl.
CPC ............ *H01L 21/02013* (2013.01); *B24B 1/00* (2013.01); *B24B 7/228* (2013.01); *B24B 37/042* (2013.01)

(58) Field of Classification Search
CPC .................. H01L 21/02013; H01L 21/02016; H01L 21/463
See application file for complete search history.

(56) References Cited

U.S. PATENT DOCUMENTS 6,077,149 A * 6/2000 Ohkuni et al. ................ 451/41
2012/0315739 A1* 12/2012 Hashii et al. ................. 438/460

FOREIGN PATENT DOCUMENTS

| JP | 08-066850 | 3/1996 |
| JP | 2006-269761 | 10/2006 |
| JP | 2010-074056 | 4/2010 |
| JP | 2011-249652 | 12/2011 |
| KR | 10-2009-0108263 | 10/2009 |
| KR | 10-2012-0091371 | 8/2012 |

OTHER PUBLICATIONS

Korean Office Action mailed Sep. 25, 2015 with respect to Korean Patent Application No. 2014-0061998, along with an english translation thereof.

* cited by examiner

*Primary Examiner* — Reema Patel
(74) *Attorney, Agent, or Firm* — Greenblum & Bernstein, P.L.C.

(57) ABSTRACT

A surface of a semiconductor wafer is subjected to high flattening processing.

A resin application and grinding step is repeatedly carried out, the step including determining as a reference surface a flat surface obtained by applying a curable material to one entire surface of a wafer sliced out from a semiconductor single crystal ingot with the use of a wire saw apparatus and performing surface grinding with respect to the other surface of the wafer, and determining as a reference surface the other surface of the wafer subjected to the surface grinding and performing the surface grinding with respect to the one surface of the wafer.

4 Claims, 11 Drawing Sheets (EXAMPLES 1-1, 1-2)
RESIN APPLICATION AND
GRINDING PERFORMED
TWICE (COMPARATIVE EXAMPLE 2)
SURFACE GRINDING + RESIN APPLICATION AND GRINDING PERFORMED ONCE FIG.7
NANOTOPOGRAPHY MAP
HEIGHT DIFFERENCE
+20nm
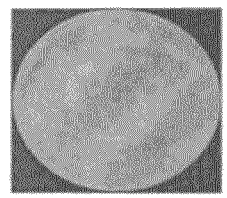 EXAMPLE 1-1
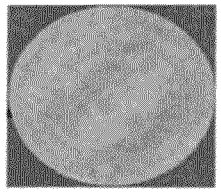 EXAMPLE 1-2
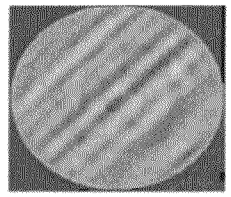 COMPARATIVE EXAMPLE 1
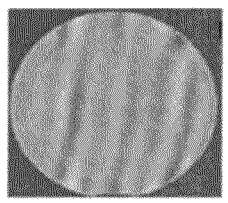 COMPARATIVE EXAMPLE 2
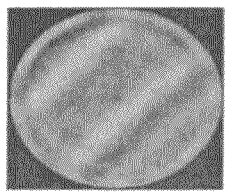 COMPARATIVE EXAMPLE 3
−20nm

MACHINING PROCESS FOR SEMICONDUCTOR WAFER

TECHNICAL FIELD

The present invention relates to a machining process for a semiconductor wafer, and more particularly to a machining process for highly flattening a surface of a semiconductor wafer.

BACKGROUND ART

As regards semiconductor wafers, flattening a surface of a wafer has been conventionally demanded in order to create a fine pattern based on a photomechanical process. In particular, surface waviness that is called "nanotopography" is waviness having a component of a wavelength $\lambda=0.2$ to 20 mm and a PV value (a Peak to Valley value) of 0.1 to 0.2 µm or less, and a technology for improving flatness of a semiconductor wafer by reducing this nanotopography has been suggested in recent years. As such a flattening machining method for a wafer, there has been disclosed a machining process including a resin applying step of covering an entire first surface of a wafer sliced out from an ingot and a step of holding the first surface of the wafer, grinding a second surface of the wafer, then holding the second surface of the wafer, and grinding the first surface of the wafer (e.g., Patent Document 1). Further, there has been disclosed a machining process including a primary grinding step of holding a first surface of a wafer sliced out from an ingot, grinding a second surface of the wafer, then holding the second surface of the wafer, and grinding the first surface of the wafer, a resin applying step of covering the entire second surface of the wafer with a resin after the primary grinding step, and a step of holding the second surface of the wafer as a reference surface after the resin applying step, grinding the first surface of the wafer, removing the resin, and then determining the first surface of the wafer as a reference surface, and grinding the second surface of the wafer (e.g., Patent Document 2). Furthermore, there has been disclosed a machining process including a lapping step or a double-disk grinding step of uniforming a thickness of a wafer sliced out from an ingot by lapping or double-disk grinding and removing waviness of the wafer generated by slicing, and a grinding step of performing surface grinding with respect to surfaces of the wafer in accordance with each surface or at the same time (e.g., Patent Document 3).

On the other hand, as a method for slicing a single-crystal ingot, a method for performing slicing by a fixed abrasive grain type wire saw having abrasive grains fixed on a wire outer peripheral surface is to be used in place of a loose abrasive grain type for supplying a cutting fluid containing abrasive grains to a wire saw in order to assuredly supply the abrasive grains to a position near the center of a growth axis of a crystalline ingot (e.g., Patent Document 4).

PRIOR ART REFERENCE

Patent Documents

Patent Document 1
Japanese Unexamined Patent Application Publication No. Hei 08-066850 (Paragraphs [0018] to [0025], FIG. 1)
Patent Document 2
Japanese Unexamined Patent Application Publication No. 2011-249652 (Paragraph [0008], FIG. 2)
Patent Document 3
Japanese Unexamined Patent Application Publication No. 2006-269761 (Paragraphs [0002] and [0003], FIG. 7)
Patent Document 4
Japanese Unexamined Patent Application Publication No. 2010-074056 (Paragraphs [0002] to [0005])

SUMMARY OF THE INVENTION

Problems to be Solved by the Invention

At the grinding step based on the resin application processing shown in Patent Document 1, since the resin application processing is carried out in a state that waviness or warp of the wafer is unchanged, grinding must be performed with a large stock removal in order to absorb all of the waviness and the warp. Moreover, in Patent Document 2, a wafer surface on a non-sucked surface side is performed in a state that a flat reference surface obtained by forcedly straightening large waviness produced at the slicing step is formed by sucking and holding a wafer on a holding surface to remove a distortion component at the time of slicing. Therefore, after the grinding, when the suction and the holding are released, the waviness of an unground wafer surface on a sucked surface side is restored to a state before the sucking and the holding, this waviness is transferred to the wafer surface on the non-sucked surface side flattened by the grinding, and a large part of the waviness remains on the wafer surface. On the other hand, in Patent Document 3, a long period of time is required to remove waviness or warp by lapping.

Additionally, in the prior art, even if the waviness remains on the wafer surface, the grinding processing is carried out to remove the waviness in a state that the flat reference surface has been created by using the resin applied to the wafer surface at the resin applying step, or the waviness is removed at the lapping step, and hence a surface state of the wafer at the time of slicing is not viewed as a problem. However, experiments conducted by the present inventors have revealed that nanotopography quality of the wafer surface after a mirror polishing processing is not sufficient even if such resin application processing as described in Patent Documents 1 to 3, processing as a combination of the resin application processing and the grinding processing (resin application and grinding), or processing as a combination of lapping and the grinding processing is carried out.

Further, it has been also revealed that, if the fixed abrasive grain type wire saw is used at the slicing step, processing damage to the wafer is serious, the waviness produced on the wafer surface after slicing is also large, and hence there is a problem that the nanotopography becomes worse.

SUMMARY OF THE INVENTION

An object of the present invention is to provide a machining process for a semiconductor wafer superior in nanotopography characteristics, i.e., having a small nanotopography value by improving the nanotopography of a wafer in a plurality of times, and particularly a machining process for highly flattening a surface of a semiconductor wafer.

Means for Solving the Problems

To achieve the object, as a result of conducting keen examinations, the present inventors have discovered that, in case of coating a surface of a wafer with a curable material and performing surface grinding, repeatedly effecting the surface grinding twice or more can provide better nanotopography quality of a finally obtained semiconductor wafer as compared with effecting the surface grinding only once even though a total stock removal is small, thereby bringing the present invention to completion. Specifically, a first surface of the wafer is coated with the curable material after slicing, a second surface is subjected to the surface grinding, the curable material is removed, then the second surface is determined as a reference surface, and the first surface is subjected to the surface grinding. In case of repeatedly performing this step, reducing a stock removal in the second step to be smaller than that in the first step enables improving the quality of the nanotopography.

According to a first aspect of the present invention, there is provided a machining process for a semiconductor wafer including a step of grinding a wafer obtained from a slicing step of slicing a semiconductor single crystal ingot by using a wire saw apparatus to obtain a thin discoid wafer, the process repeatedly performing a resin application and grinding step comprising: a first application layer forming step of applying a curable material to one entire surface of the wafer after the slicing step to form a flat application layer; a first surface grinding step of mounting the wafer on a table of a grinding apparatus in such a manner that one surface of the flattened wafer abuts on a reference surface of the table, and then performing surface grinding with respect to the other surface of the wafer with the use of the grinding apparatus; a first application layer removing step of removing the application layer after the first surface grinding step from the one surface of the wafer; and a second surface grinding step of mounting the wafer on the table of the grinding apparatus in such a manner that the other surface of the wafer from which the application layer has been removed abuts on the reference surface of the table, and then performing surface grinding with respect to the one surface of the wafer with the use of the grinding apparatus.

According to a second aspect of the present invention, in the invention based on the first aspect, a grinding amount at the resin application and grinding step that is performed precedently is equal to or higher than a grinding amount at the resin application and grinding step that is performed afterwards.

According to a third aspect of the present invention, in the invention based on the first or second aspect, assuming that a sum total of a grinding amount at the resin application and grinding step that is performed precedently and a grinding amount at the resin application and grinding step that is performed afterwards is 100, the grinding amount at the resin application and grinding step that is performed precedently is 50 to 80, and the grinding amount at the resin application and grinding step that is performed afterwards is 20 to 50.

According to a fourth aspect of the present invention, in the invention based on the first to third aspects, the wire saw apparatus is a slicing type using a fixed abrasive grain wire.

According to a fifth aspect of the present invention, in the invention based on the first to fourth aspects, a diameter of the semiconductor wafer is 300 mm or more, especially 450 mm or more.

Effects of the Invention

According to the first aspect of the present invention, there is provided the machining process for a semiconductor wafer including a step of grinding a wafer obtained from a slicing step of slicing a semiconductor single crystal ingot by using a wire saw apparatus to obtain a thin discoid wafer, the process repeatedly performing a resin application and grinding step comprising: a first application layer forming step of applying a curable material to one entire surface of the wafer after the slicing step to form a flat application layer; a first surface grinding step of mounting the wafer on a table of a grinding apparatus in such a manner that one surface of the flattened wafer abuts on a reference surface of the table, and then performing surface grinding with respect to the other surface of the wafer with the use of the grinding apparatus; a first application layer removing step of removing the application layer after the first surface grinding step from the one surface of the wafer; and a second surface grinding step of mounting the wafer on the table of the grinding apparatus in such a manner that the other surface of the wafer from which the application layer has been removed abuts on the reference surface of the table, and then performing surface grinding with respect to the one surface of the wafer with the use of the grinding apparatus, whereby the waviness in the wavelength range that affects the nanotopography quality can be reduced as much as possible even though a total stock removal of grinding is small and the semiconductor wafer superior in the nanotopography quality can be provided.

According to the second aspect of the present invention, when the grinding amount at the resin application and grinding step precedently performed is set to be equal to or higher than the grinding amount at the resin application and grinding step performed afterwards, the waviness in the wavelength range that affects the nanotopography quality can be reduced as much as possible even though a total stock removal of grinding is small and the semiconductor wafer superior in the nanotopography quality can be provided.

According to the third aspect of the present invention, assuming that a sum total of the grinding amount at the resin application and grinding step precedently performed and the grinding amount at the resin application and grinding step performed afterwards is 100, the grinding amount at the resin application and grinding step precedently performed is 50 to 80 and the grinding amount at the resin application and grinding step performed afterwards is 20 to 50, thereby the waviness in the wavelength range that affects the nanotopography quality can be reduced as much as possible even though a total stock removal of grinding is small and the semiconductor wafer superior in the nanotopography quality can be provided.

According to the fourth aspect of the present invention, even in case of using a wafer with large waviness sliced out by a fixed abrasive grain type wire saw apparatus in particular, this machining process enables reducing the waviness as much as possible and providing the semiconductor wafer superior in the nanotopography quality.

According to the fifth aspect of the present invention, even if a diameter of the semiconductor wafer is 300 mm or more, especially 450 mm or more, the machining process for a semiconductor wafer according to the present invention enables reducing the waviness in the wavelength range that affects the nanotopography quality as much as possible even though a total stock removal of grinding is small and also enables providing the semiconductor wafer superior in the nanotopography quality.

BRIEF DESCRIPTION OF THE DRAWINGS

FIG. 7 is a nanotopography map after mirror polishing according to Examples 1-1 and 1-2 and Comparative Examples 1, 2, and 3;

MODES FOR CARRYING OUT THE INVENTION

Preferred embodiments according to the present invention are described in more details with reference to the attached drawings hereinafter.

Figure 1:
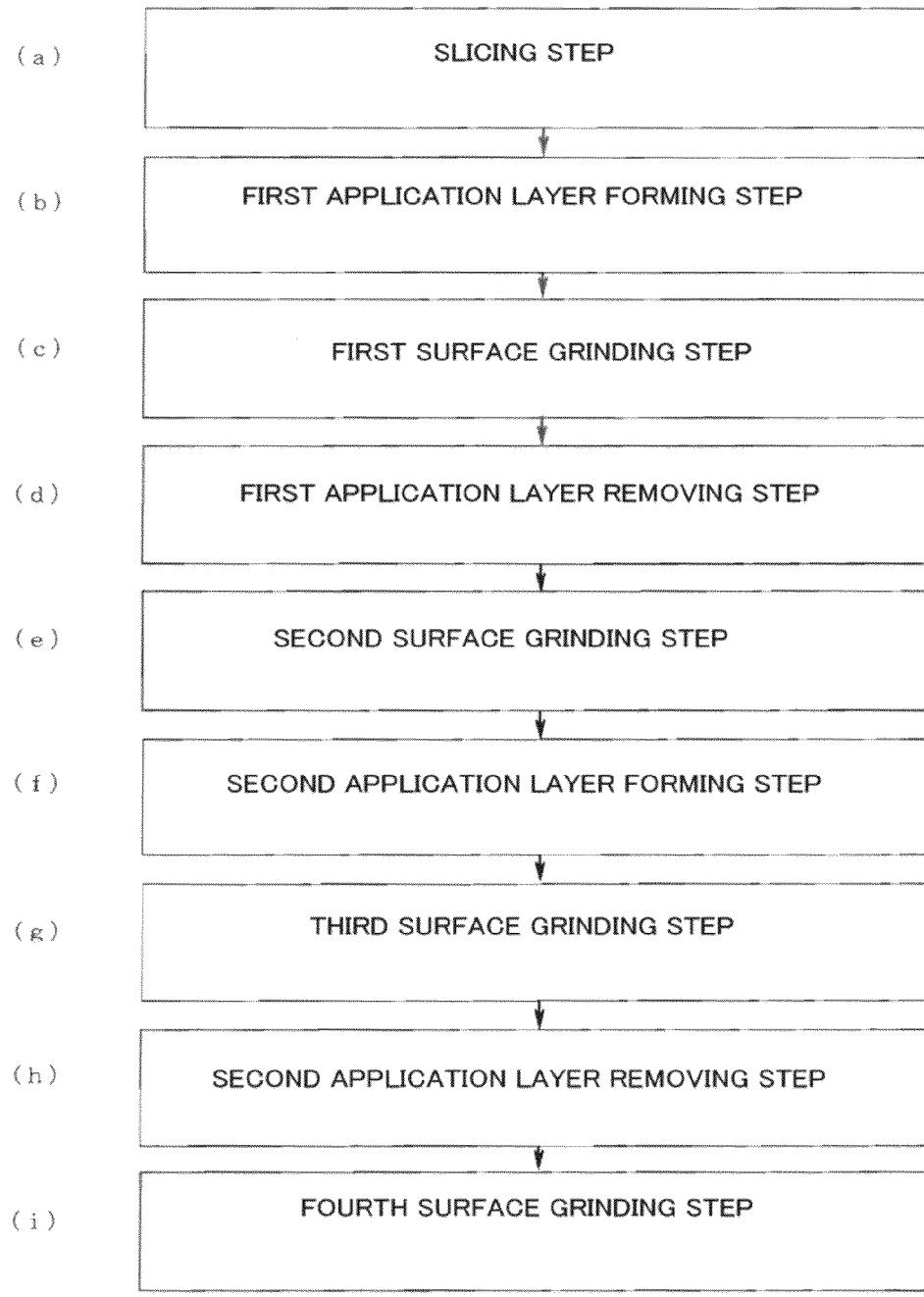
FIG. 1 is a view for explaining outline steps in a wafer machining process according to an embodiment of the present invention.

As shown in (a) to (i) in FIG. 1, the present invention provides an improvement in a machining process for machining a semiconductor wafer and flattening a surface of the semiconductor wafer by repeatedly carrying out steps from a first application layer forming step to a second surface grinding step, the machining process including a slicing step of slicing a semiconductor single crystal ingot with the use of a wire saw apparatus to obtain a thin discoid wafer, the first application layer forming step of applying a curable material to one entire surface of the wafer after the slicing step to form a flat application layer, a first surface grinding step of mounting the wafer on a table of a grinding apparatus in such a manner that the flattened one surface of the wafer abuts on a reference surface of the table and then performing surface grinding with respect to the other surface of the wafer with the use of the grinding apparatus, a first application layer removing step of removing the application layer subjected to the surface grinding step from the one surface of the wafer, and the second surface grinding step of mounting the wafer on the table in such a manner that the other surface of the wafer from which the application layer has been removed abuts on the reference surface of the table of the grinding apparatus and then performing surface grinding with respect to the one surface of the wafer with the use of the grinding apparatus. It is to be noted that a step of chamfering an outer edge of the semiconductor wafer is not described in particular, but the chamfering step might be carried out at any timing after end of FIG. 1(a) to end of FIG. 1(i). For example, as the chamfering step, primary chamfering can be performed after end of FIG. 1(e), and secondary chamfering with a larger chamfering amount than the primary chamfering can be carried out after (i). Alternatively, the chamfering step might be carried out more than once.

A characteristic configuration of the present invention lies in that the steps from the first application layer forming step to the second surface grinding step represented by (b) to (e) in FIG. 1 are repeatedly carried out. Here, the steps from the first application layer forming step to the second surface grinding step will be referred to as a resin application and grinding step. When the resin application and grinding step is divided into a plurality of steps, nanotopography characteristics of a wafer surface are met. That is, to improve the nanotopography by resin application and grinding performed once, a stock removal that enables removing all components of waviness present in a wafer must be set and grinding must be performed, but it was found out that, in case of repeatedly carrying out the resin application and grinding, all components of waviness are not ground by the first resin application and grinding, but a considerably large component of waviness produced in the slicing step is reduced by the first resin application and grinding, and the second or subsequent resin application and grinding is performed with respect to the wafer from which the component of waviness has been reduced in advance, thereby improving the nanotopography characteristics. As described above, when the resin application and grinding is repeatedly carried out, the waviness of the wafer surface is reduced, and the components of waviness in a wavelength range of 100 mm or less are decreased as much as possible. As a result, the nanotopography characteristics of the wafer surface can be improved.

Figure 2:
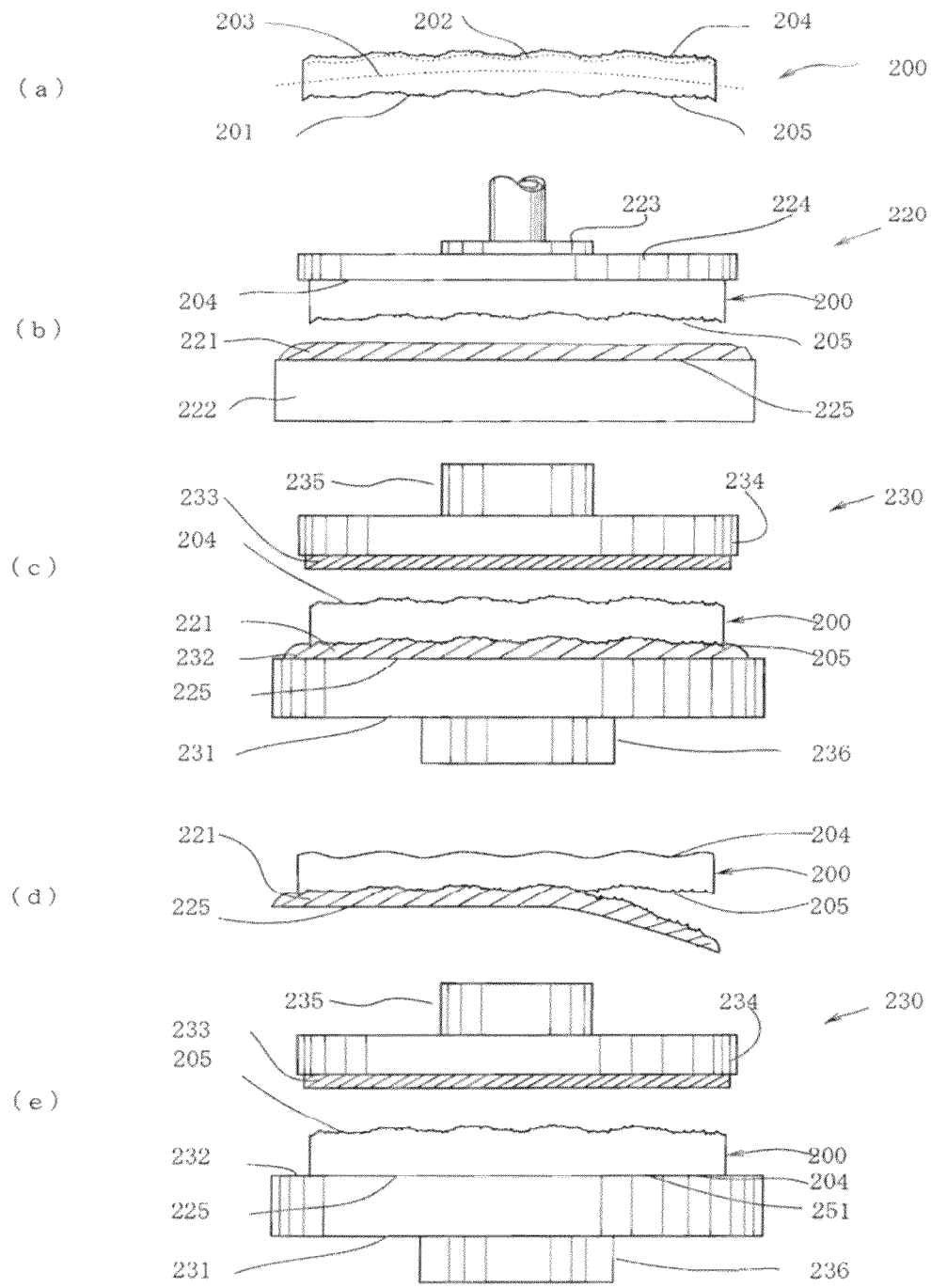
FIG. 2 is a schematic view showing an example from an application layer forming step to a surface grinding step according to the embodiment of the present invention.

An embodiment according to the present invention will now be described hereinafter in detail with reference to FIG. 2. FIG. 2(a) shows a state of a wafer 200 immediately after slicing that was sliced out with the use of a fixed abrasive grain wire saw. A non-illustrated well-known multiwire saw apparatus is used for slicing, and a plurality of wafers 200 can be manufactured from an ingot at a time. In the multiwire saw apparatus, a very thin steel wire are wound for a plurality of turns around a guide roller having a plurality of grooves for guiding the wire provided thereon and a roller that rotates the wire. This is an apparatus that rotates the rollers at a high speed, presses an object to be sliced against the plurality of wires exposed between the guide roller and the roller, and slices the object to be sliced into a plurality of pieces. As the multiwire saw apparatus, there are a fixed abrasive grain type and a loose abrasive grain type depending on each usage of abrasive grains for slicing. In the fixed abrasive grain type, a steel wire to which diamond abrasive grains or the like adhere by, e.g., evaporation is used as the wire. In the loose abrasive grain type, the wire is used while applying a slurry containing abrasive grains and an oil solution. In the fixed abrasive grain type, since the wire having the abrasive grains secured thereto slices an object to be sliced, a slicing time is short, and productivity is excellent. Further, since the slurry is not used and hence the slurry containing chips after slicing does not have to be discarded, this apparatus is environment-friendly and economical. Both the types can be used in the present invention, but the fixed abrasive grain type that is environmentally and economically advantageous is desirable. It is to be noted that, when the fixed abrasive grain wire saw is used, machining damage given to a wafer surface is considerable, waviness produced on the wafer surface after slicing is also large, and hence there is a problem that the nanotopography is deteriorated, but using the machining method according to the present invention enables manufacturing a semiconductor wafer that is superior in nanotopography characteristics, i.e., has a small value of nanotopography.

In the wafer 200 (FIG. 2(a)) immediately after slicing obtained by slicing using the fixed abrasive grain wire saw, machining damage (a machining damage layer) 201, uneven waviness 202 that is periodically choppy 202, and a warp 203 are produced by wire saw slicing machining. For the convenience's sake, an upper surface in FIG. 2(a) that is a convex surface side of the warp 203 of the wafer 200 is determined as a first surface 204, and a lower surface in FIG. 2(a) which is a concave surface side of the warp 203 of the wafer 200 is determined as a second surface 205.

FIG. 2(b) shows an example of a holding/pressing apparatus 220 that is used for the application layer forming step. First, a curable material 221 that turns to an application layer is dropped onto a highly flattened flat plate 222 of the holding/pressing apparatus 222. On the other hand, the wafer 200 has the first surface 204 of the wafer 200 sucked and held by a pressing table 224 of holding means 223, moves down the pressing table 224, and presses the second surface 205 of the wafer 200 against the curable material 221. Then, a pressure of the pressing table 224 is released, and the curable material 221 is cured on the second surface 205 of the wafer 200 in a state that the warp 203 or the waviness 202 remaining in the wafer 200 is not elastically deformed. Based on this step, a surface of the curable material 221 that is in contact with the flat plate 222 turns to a highly flattened surface, and it can be used as a reference surface 225 that is used at the time of grinding the first surface 205 of the wafer 200.

As a method for applying the curable material 221 to the wafer 200, it is possible to apply a spin coat method for determining the second surface 205 of the wafer 200 as an upper surface, dropping the curable material 221 onto the second surface 205, rotating the wafer 200, and spreading the curable material 221 on the entire second surface 205, a method using screen printing for disposing a screen film on the second surface 205, mounting the curable material 221 on the screen film, pressing the material by using a squeegee, or a method for effecting application by, e.g., spraying on the entire second surface 205 based on an electric spray deposition method, then bringing an application surface into contact with the highly flattened flat surface 222, and pressing the same. Besides these method, it is possible to apply a method for highly flattening one surface of the wafer 200 by using the curable material 221. As the curable material 221, the curable material 221 such as a thermosetting resin, a thermoreversible resin, or a photosensitive resin is preferable in terms of easiness in delamination after machining. In particular, the photosensitive resin is preferable since stress due to heat is not applied thereto. In this example, a UV curing resin was used as the curable material 221. Furthermore, as other specific curable materials 221, there are synthetic rubber, an adhesive (wax or the like), and others.

FIG. 2(c) shows an example of a surface grinding apparatus 230 used at the first surface grinding step. First, the reference surface 225 made of the curable material 221 created at the application layer flattening step is mounted on, and sucked and held on the highly flattened reference surface 232 of a vacuum chuck table 231 of the surface grinding apparatus 230. Then, a surface plate 234 having a grindstone 233 disposed on one surface thereof is mounted on the upper surface of the set wafer 200. Then, the grindstone 233 is brought into contact with the first surface 204 of the wafer 200, a spindle 235 on an upper side of the surface plate 234 and a spindle 236 disposed on a lower portion of a vacuum chuck table 231 rotate, and a contact point of the grindstone 233 and the first surface 204 of the wafer 200 are rotated in contact, thereby grinding the first surface 204 of the wafer 200.

FIG. 2(d) shows an application layer removing step. The curable material 221 applied to the second surface 205 of the wafer 200 having the first surface 204 highly flattened at the first surface grinding step is delaminated from the wafer 200. Removal of the curable material 221 that is the application layer may be chemically removed by using a solvent.

FIG. 2(e) shows an example of the second surface grinding step. An apparatus that performs surface grinding is the same as the surface grinding apparatus 230 used at the first surface grinding step. The first surface 204 of the wafer 200 highly flattened at the first surface grinding step is determined as a reference surface 251, and mounted, sucked, and held on the highly flattened reference surface 232 of the vacuum chuck table 231. The second surface 205 of the wafer 200 is ground. The above-described step is repeated more than once. As examples of a stock removal in case of repeating the step twice, grinding is carried out 20 to 40 μm at the first surface grinding step; 20 to 40 μm at the second surface grinding step; 10 to 20 μm at the third surface grinding step; and 10 to 20 μm the fourth surface grinding step, respectively. Both the surfaces of the wafer 200 are highly flattened through the third and fourth surface grinding steps.

EXAMPLES

Next, examples according to the present invention are explained in detail together with comparative examples. It is to be noted that, as the wafer 200 used in each of Examples 1-1 and 1-2 and Comparative Examples 1, 2, and 3, a wafer 200 with a diameter of 300 mm sliced out from a silicon single crystal ingot by a fixed abrasive grain type wire saw apparatus under the same conditions was adopted, and a wafer 200 with a diameter of 450 mm sliced out by the fixed abrasive grain type wire saw apparatus under the same conditions was used in each of Examples 1-1 and 1-2 and Comparative Example 1.

Examples 1-1, 1-2

Figure 3:
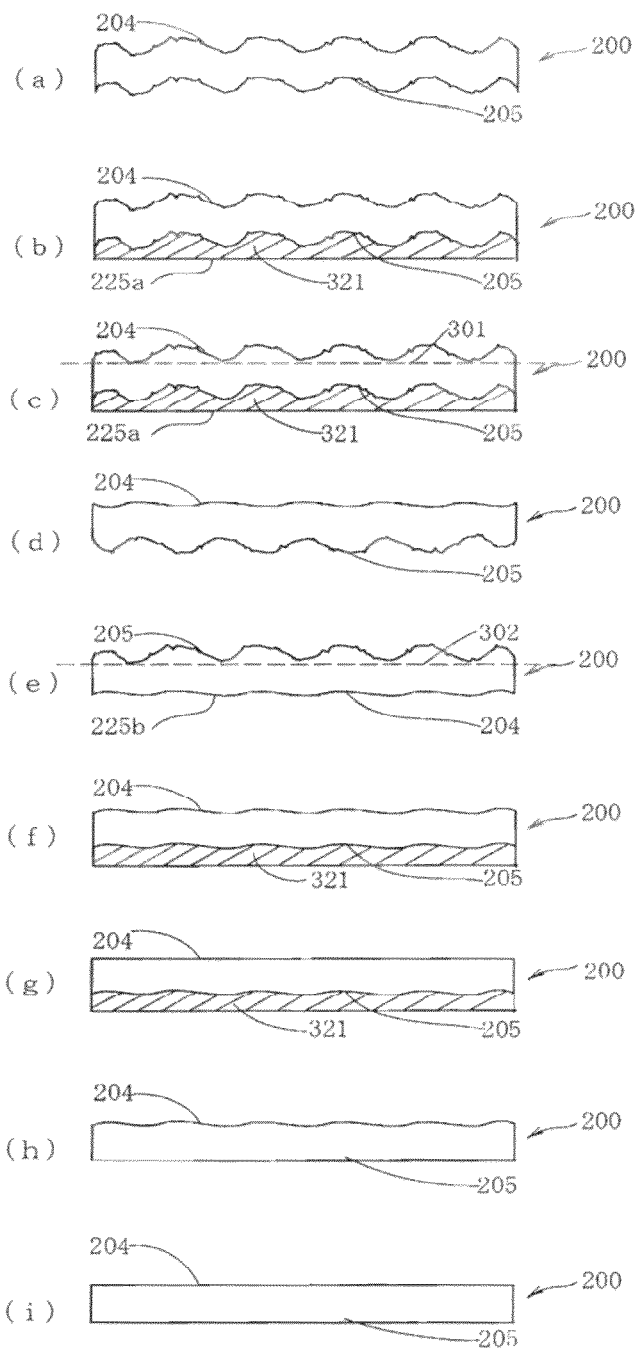
FIG. 3 is a schematic view showing a state of a wafer at each step according to Examples 1-1 and 1-2 of the present invention.

FIG. 3 shows a state of the wafer at each step according to each of Examples 1-1 and 1-2 of the present invention. Machining steps according to each example will be explained with reference to FIG. 3. In the wafer 200 after slicing (a slicing step in FIG. 3(a)), a UV curable resin 321 was applied to a second surface 205 of the wafer 200 at a first application layer forming step, and a cured resin surface was determined as a reference surface 225a (a first application layer forming step in FIG. 3(b)). Although the second surface 205 was determined as an application surface, a first surface 204 may be determined as the application surface at the beginning. If the first surface 204 was determined as the application surface, the second surface 205 and the first surface 204 will be counterchanged in the following description. The first surface 204 of the wafer 200 sucked and held while determining the resin surface as the reference surface 225a was subjected to surface grinding with a first stock removal of 30 μm in Example 1-1 and 20 μm in Example 1-2 (a surface indicated by a broken line 301) (a first surface grinding step in FIG. 3(c)). Then, the resin was delaminated (a first application layer removing step in FIG. 3(d)), the second surface 205 of the wafer 200 sucked and held while determining as a reference surface 225b the first surface 204 of the wafer 200 subjected to the surface grinding was subjected to surface grinding with a second stock removal of 30 μm in Example 1-1 and 20 μm in Example 1-2 (a surface indicated by a broken line 302) (a second surface grinding step in FIG. 3(e)). These steps are determined as a first resin applying step, and a second application layer forming step (FIG. 3(f)), a third surface grinding step (FIG. 3 (a third stock removal was 20 μm in Example 1-1 and 15 μm in Example 1-2 (FIG. 3(g))), a second application layer removing step (FIG. 3(h)), and a fourth surface grinding step (a fourth stock removal was 20 μm in Example 1-1 and 15 μm in Example 1-2 (FIG. 3(i))) were repeatedly performed as a second resin applying step. As described above, the second application layer forming step can be started from either the first surface 204 or the second surface 205. After completion of all the steps, the wafer 200 whose both wafer surfaces were highly flattened was obtained. This wafer 200 was determined as the wafer 200 in each of Examples 1-1 and 1-2 (FIG. 3(i)).

Comparative Example 1

Figure 4:
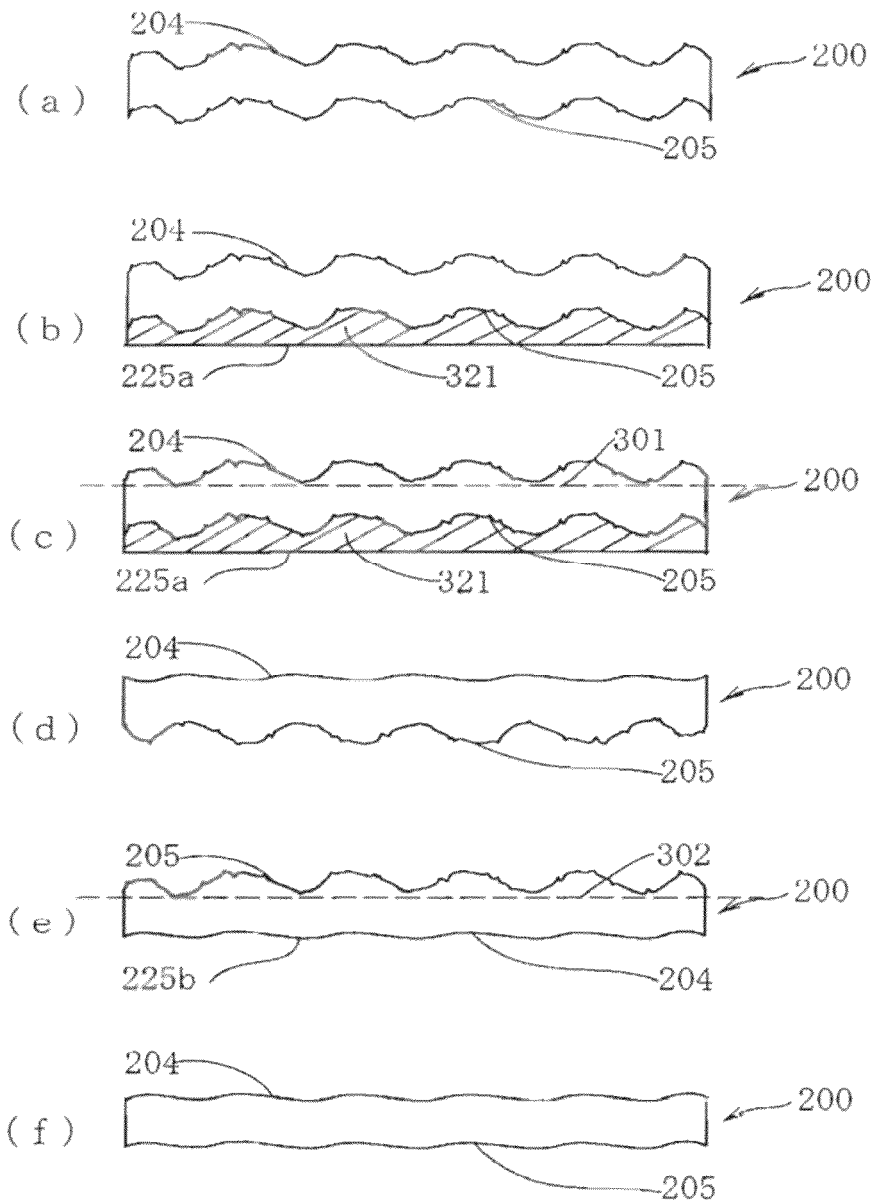
FIG. 4 is a schematic view showing a state of a wafer at each step according to Comparative Example 1.

FIG. 4 shows a state of a wafer at each step according to Comparative Example 1. In Comparative Example 1, only the first resin applying step performed in Examples 1-1 and 1-2 was carried out. FIG. 3(a) to FIG. 3(f) correspond to FIG. 4(a) to FIG. 4(f) except that the second resin applying step is not performed. Stock removals were determined as 50 μm in the first surface grinding step and 50 μm in the second surface grinding step, and grinding was carried out with such stock removals. A wafer 200 in this state was determined as a wafer 200 in Comparative Example 1 (FIG. 4(f)).

Comparative Example 2

Figure 5:
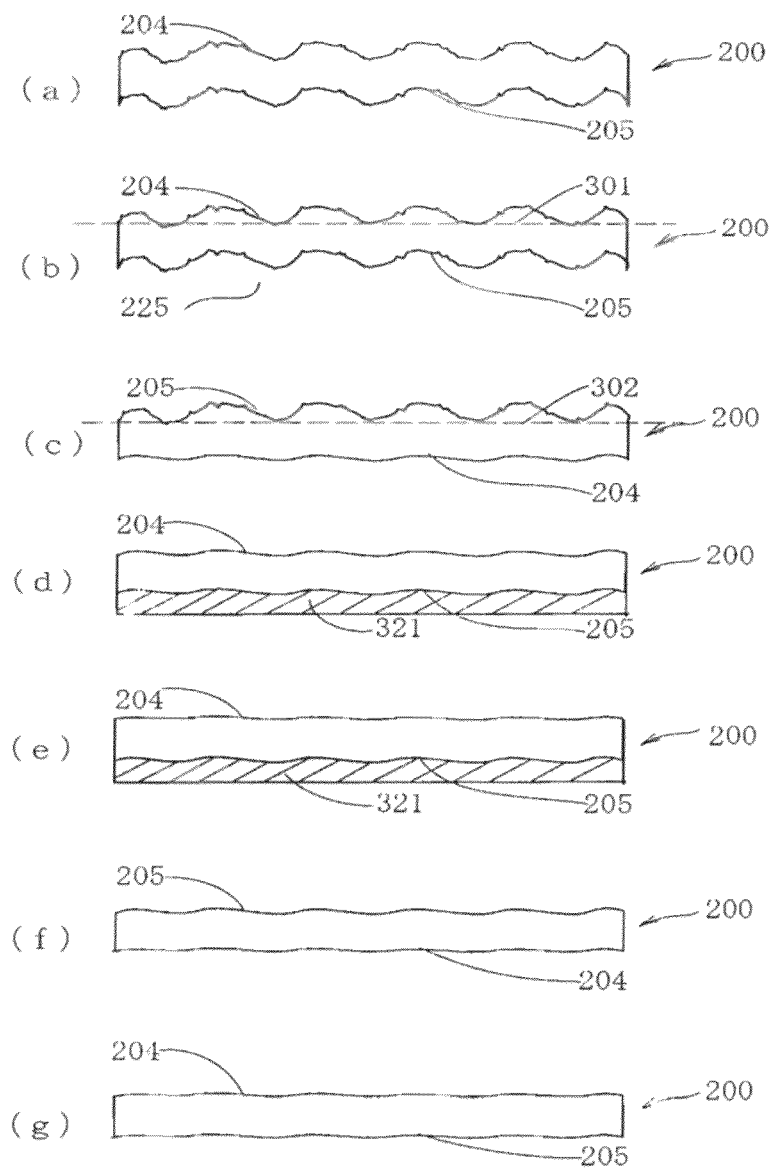
FIG. 5 is a schematic view showing a state of a wafer at each step according to Comparative Example 2.

FIG. 5 shows a state of a wafer at each step according to Comparative Example 2. In Comparative Example 2, resin application and grinding were carried out after performing surface grinding without resin application. A first surface 204 of the sliced wafer 200 (FIG. 5(a)) was subjected to surface grinding (FIG. 5(b)), and a second surface 205 was subjected to the surface grinding (FIG. 5(c)). The resin application and grinding were effected after the surface grinding (FIG. 5(d) to FIG. 5(g)). It is to be noted that the resin application and grinding based on each of FIG. 5(d) to FIG. 5(g) corresponds to FIG. 3(f) to FIG. 3(i) showing the resin application and grinding in Examples 1-1 and 1-2. The wafer 200 in this state was determined as a wafer 200 in Comparative Example 3 (FIG. 5(g)).

Comparative Example 3

Figure 6:
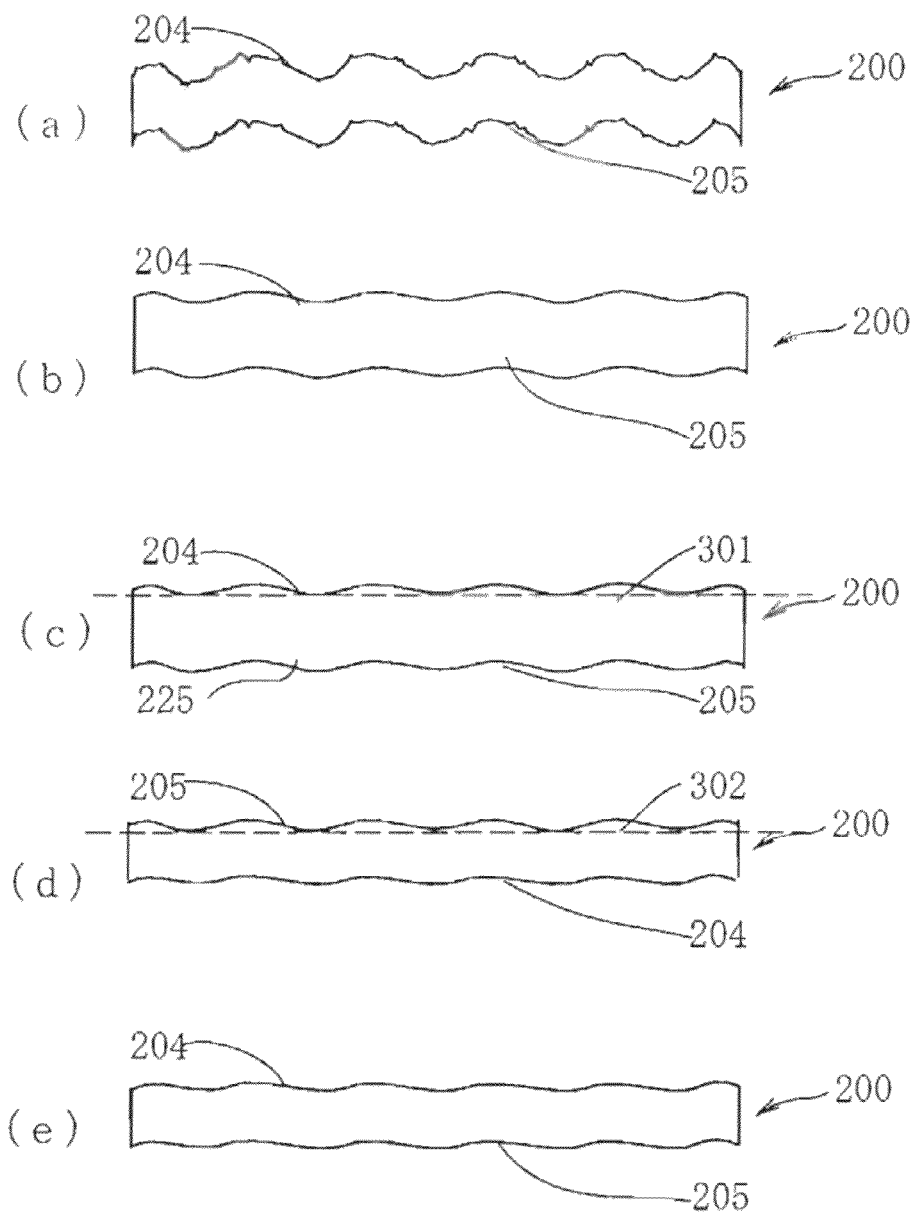
FIG. 6 is a schematic view showing a state of a wafer at each step according to Comparative Example 3.

FIG. 6 shows a state of a wafer at each step according to Comparative Example 3. In Comparative Example 3, lapping was performed, and then surface grinding was carried out without application of a resin.

As the lapping, both front and back sides of a wafer are flattened by using a non-illustrated lapping apparatus at the same time. The wafer 200 set on a processing carrier is sandwiched between two surface plates, i.e., an upper surface plate and a lower surface plate of the lapping apparatus, slurry containing abrasive grains is supplied to a space between the upper surface plate and the lower surface plate, an upper spindle and a lower spindle installed on a lower portion of the upper surface plate and an upper portion of the lower surface plate are rotated in opposite directions while applying a pressure by the upper and lower surface plates, whereby a first surface 204 and a second surface 205 are simultaneously flattened by the abrasive grains contained in the slurry.

In Comparative Example 3, both the front and back sides of the wafer 200 were simultaneously flattened by the above-described lapping (FIG. 6(b)). The lapped wafer 200 was subjected to surface grinding as shown in FIG. 6(c) to FIG. 6(e). The surface grinding shown in FIG. 6(c) to FIG. 6(e) corresponds to FIG. 5(b) to FIG. 5(d) except that application of the resin is effected in FIG. 5(d). The wafer 200 in this state was determined as a wafer in Comparative Example 3 (FIG. 6(e)).

<Evaluation Test 1>

How a surface shape of each wafer 200 obtained in Examples 1-1 and 1-2 and Comparative Examples 1, 2, and 3 affects nanotopography on a wafer surface after mirror polishing processing that is subsequently performed was examined. Specifically, first, both front and back sides of each wafer 200 obtained in Examples 1-1 and 1-2 and Comparative Examples 1, 2, and 3 were subjected to rough polishing processing under the same conditions by using a double-side polishing apparatus as common mirror polishing processing, and then each wafer surface was subjected to finish polishing processing under the same conditions by using single-side polishing apparatus, thereby creating each wafer 200 having mirror-polished surfaces. FIG. 7 is a nanotopography map obtained by measuring a height distribution (a height difference) of each mirror-polished wafer surface with the use of an optical interference type flatness measuring apparatus (KLA Tencor Corporation: Wafersight 2), in which nanotopography measurement results are shown in gradation colors after filtering measurement results of the respective mirror-polished wafers to remove long wavelength components. Each view showing a height difference in FIG. 7 is a view showing a height difference of the nanotopography, a darker color represents a lower degree of elevation, the darkest portion corresponds to −20 nm from a center elevation, a lighter color represents a higher degree of elevation, and the lightest portion corresponds to +20 nm from the center elevation. A height difference between a minimum elevation and a maximum elevation is 40 nm. It is to be noted that the nanotopography was measured by fixing arbitrary three points on an outer edge of each wafer. Therefore, the nanotopography map represents a height difference on the surface of each wafer in a non-sucked state.

Nanotopography measurement results are shown in a nanotopography map in FIG. 7. It can be understood that each of Examples 1-1 and 1-2 has a substantially uniform color depth and a small height difference on the entire surface. It can be considered that this result was obtained because the nanotopography characteristics on the wafer surface were improved even though a warp and waviness were not completely eliminated by the first resin application and grinding, the warp and waviness were reduced by the first resin application and grinding, and the nanotopography characteristics were improved with a stock removal decreased by the reduced warp and waviness at the second resin application and grinding step, thereby obtaining the highly flattened surface.

In Comparative Example 1, a height difference with a striped pattern of a gradation can be confirmed on the entire wafer. Therefore, it can be understood that the height difference caused due to the waviness largely remains on the whole. It was revealed that, to remove the warp and the waviness by the first resin application and grinding, surface grinding must be performed with a larger stock removal.

In Comparative Example 2, a height difference with a striped pattern can be confirmed on the entire wafer but it is not as remarkable as Comparative Example 1. Therefore, it can be understood that the height difference caused due to the waviness remains on the whole. It can be considered that this result was obtained since the first surface 204 of the wafer 200 can be highly flattened immediately after performing surface grinding with respect to the first surface 204 of the wafer 200 in FIG. 5(b), but a stress applied to the wafer is released when suction and holding are canceled, and the warp and the waviness appear on the first surface 204 due to a stress produced from the waviness 202 formed on the second surface 205. Therefore, it can be considered that, in Comparative Example 2, a highly flattened surface like those in Examples 1-1 and 1-2 cannot be obtained.

In Comparative Example 3, a height difference with a striped pattern can be confirmed on the entire wafer, but the height difference is smaller than those in Comparative Examples 1 and 2. It can be considered that this result was obtained since the nanotopography characteristics were improved by reducing the waviness 202 in a wavelength range of 100 mm or less, especially 50 mm or less based on lapping. However, it can be considered that, at a subsequent surface grinding step, when the suction and the holding are canceled like the above description, the stress applied to the wafer is released, the warp and the waviness appear on the first surface 204 by the stress caused due to the waviness 202 applied to the second surface 205, and hence the height difference that is more prominent than those in Examples 1-1 and 1-2 appears.

<Evaluation Test 2>

Figure 8:
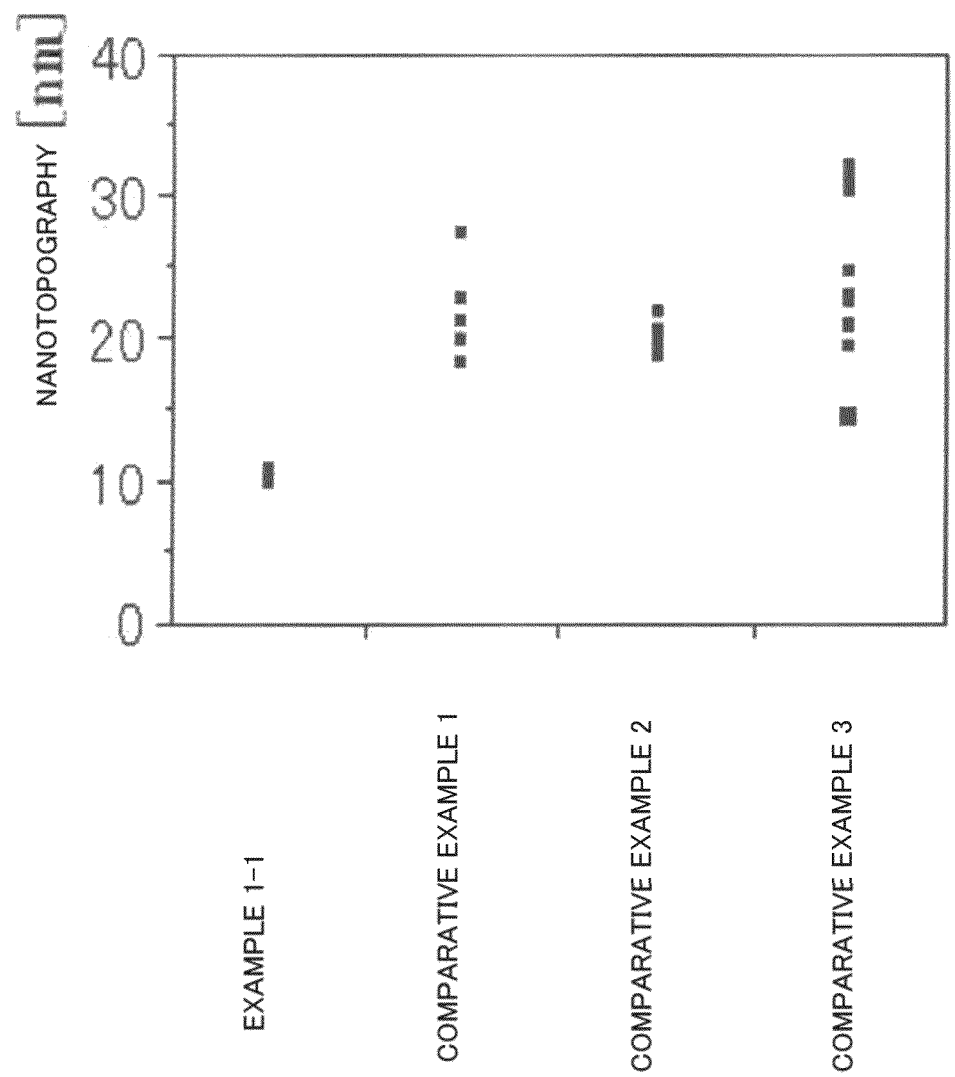
FIG. 8 is a view showing nanotopography results according to Examples 1-1 and Comparative Examples 1, 2, and 3.
Figure 9:
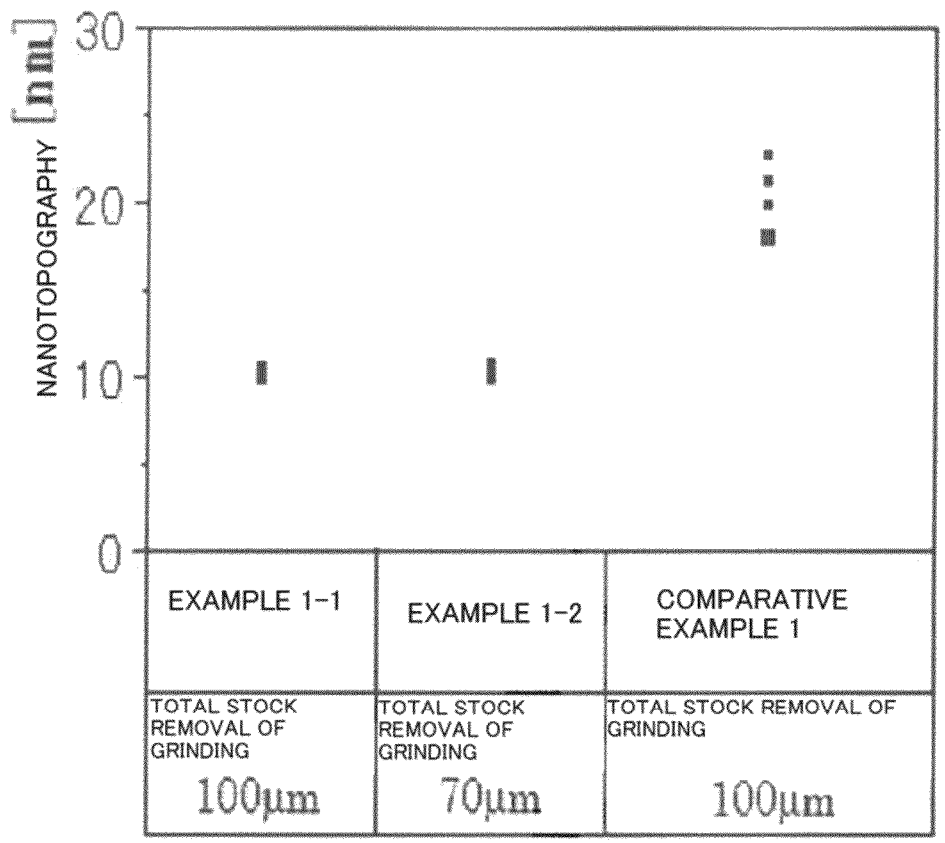
FIG. 9 is a view showing nanotopography results according to Examples 1-1 and 1-2 and Comparative Example 1.

Like Evaluation Test 1, how a surface shape of each wafer 200 affects the nanotopography on a wafer surface after the mirror polishing processing was examined. In this test, a plurality of wafers 200 meeting the same conditions as those in Examples 1-1 and 1-2 and Comparative Examples 1, 2, and 3 were manufactured, mirror polishing processing (rough polishing processing using a double-side polishing apparatus+finish polishing processing using a single-side polishing apparatus) meeting the same conditions as those of Evaluation Test 1 was performed with respect to each of the plurality of wafers 200, and the wafers 200 each having mirror-polished surfaces were created. FIGS. 8 and 9 are graphs each showing results of measuring nanotopography of a window size 10 mm of a mirror-polished surface of each wafer 200 with the use of an optical interference type flatness measuring apparatus (KLA Tencor Corporation: Wafersight 2).

As obvious from FIGS. 8 and 9, a height difference was 9 to 11 nm in each of Examples 1-1 and 1-2; 17 to 28 nm, Comparative Example 1; 18 to 23 nm, Comparative Example 2; and 13 to 33 nm in Comparative Example 3. In the wafer 200 in each of Examples 1-1 and 1-2, the highly flattened surface having the entire surface nanotopography of 11 nm or less was obtained.

<Evaluation Test 3>

Figure 10:
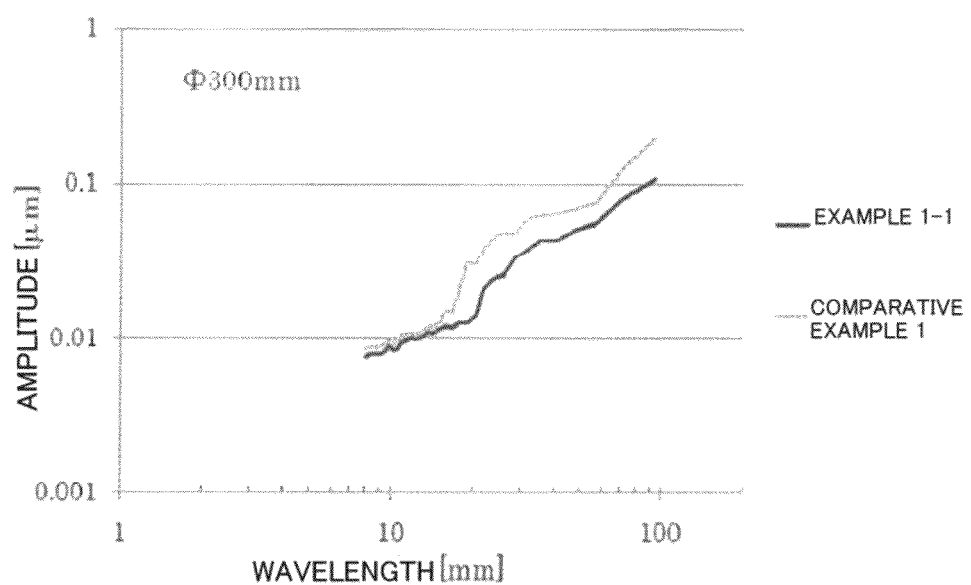
FIG. 10 is a view showing a result of performing frequency analysis with respect to a wafer surface height of a 300-mm wafer before mirror polishing according to each of Example 1-1 and Comparative Example 1.
Figure 11:
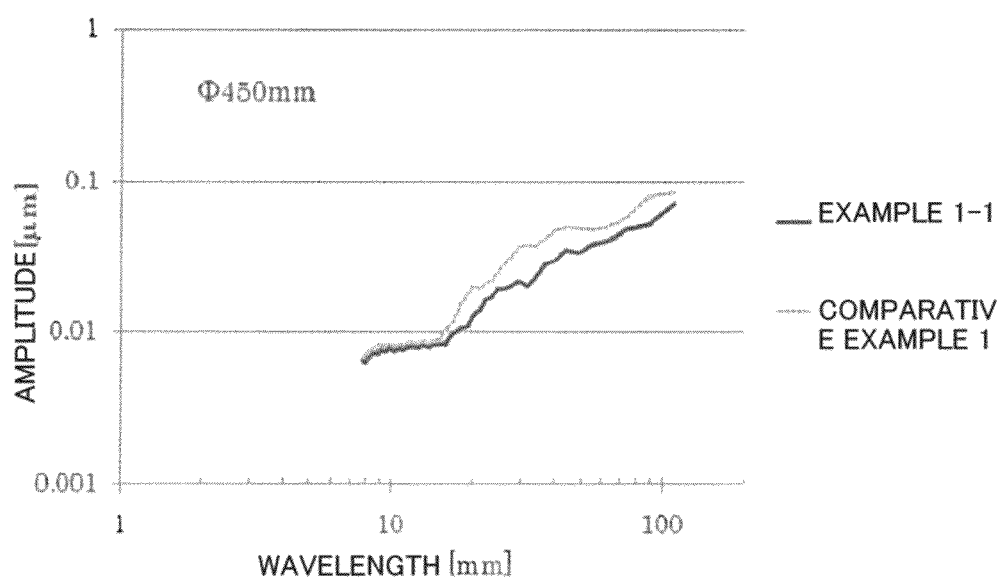
FIG. 11 is a view showing a result of performing frequency analysis with respect to a wafer surface height of a 450-mm wafer before mirror polishing according to each of Example 1-1 and Comparative Example 1.

Subsequently, frequency analysis was conducted with respect to a surface height of each wafer 200 before performing the mirror polishing processing, and an amplitude of a wavelength of a waviness component was examined. FIGS. 10 and 11 show results of this test.

FIG. 10 shows a result of performing frequency analysis of a surface height of a wafer 200 with the use of an electrostatic capacitive shape measuring apparatus (KOBELCO Research Institute: SBW) with respect to the following wafers:
the wafer 200 after performing the resin application and grinding twice shown in FIG. 3(i) (Example 1-1); and
the wafer 200 after performing the resin application and grinding once shown in FIG. 4(f) (Comparative example 1), and FIG. 11 shows a result of performing the same with respect to the following wafers:
the wafer 200 after performing the resin application and grinding twice shown in FIG. 3(i) (Example 1-1); and
the wafer 200 after performing the resin application and grinding once shown in FIG. 4(f) (Comparative example 1). As an analysis method, wavelength bands including a short-wavelength period component of less than 10 mm and a long-wavelength period component of 100 mm or more were cut off, bandpass filtering processing was performed with respect to surface height measurement data of each wafer 200, and an amplitude of a wavelength of a waviness component in a wavelength range of 10 mm to 100 mm was obtained.

As obvious from FIG. 10, a maximum amplitude of 0.2 μm was observed in (Comparative Example 1) that is the wafer 200 having a diameter of 300 mm subjected to the resin application and grinding effected once, whereas a maximum amplitude was 0.1 μm in (Example 1-1) that is the wafer 200 having a diameter of 300 mm subjected to the resin application and grinding effected twice, and it was revealed that the amplitude can be greatly reduced by performing the resin application and grinding processing twice. Furthermore, as obvious from FIG. 11, a maximum amplitude of 0.09 μm was observed in (Comparative Example 1) that is the wafer 200 having a diameter of 450 mm subjected to the resin application and grinding effected once, whereas a maximum amplitude of 0.08 μm was observed in (Example 1-1) that is the wafer 200 having a diameter of 450 mm subjected to the resin application and grinding effected twice, and it was revealed that the amplitude of the waviness can be reduced in the wafer of 450 mm by performing the resin application and grinding processing twice like the wafer of 300 mm.

INDUSTRIAL APPLICABILITY

The machining process for a semiconductor wafer according to the present invention can be used for a step of flattening a surface of a wafer sliced out from an ingot of silicon, gallium, or the like.

What is claimed is:

1. A machining process for a semiconductor wafer including grinding a wafer obtained by slicing a semiconductor single crystal ingot by using a wire saw apparatus to obtain a thin discoid wafer, the process comprising:
    (i) forming a layer by applying a curable material to one entire surface of the wafer after slicing to form a flat application layer;
    (ii) firstly grinding a surface by mounting the wafer on a table of a grinding apparatus in such a manner that the one surface of the flattened wafer abuts on a reference surface of the table, and then performing surface grinding with respect to the other surface of the wafer with the use of the grinding apparatus;
    (iii) removing an application layer by removing the application layer from the one surface of the wafer after firstly grinding the other surface of the wafer; and
    (iv) secondly grinding the surface by mounting the wafer on the table of the grinding apparatus in such a manner that the other surface of the wafer from which the application layer has been removed abuts on the reference surface of the table, and then performing surface grinding with respect to the one surface of the wafer with the use of the grinding apparatus;
    wherein (i) forming a layer to (iv) secondly grinding the surface are repeatedly performed; and
    wherein a grinding amount when grinding the surface of the wafer to which the curable material has been applied that is performed precedently is equal to or higher than a grinding amount when grinding the surface of the wafer to which the curable material has been applied that is performed afterwards.

2. The machining process for a semiconductor wafer according to claim 1, wherein, assuming that a sum total of a grinding amount when grinding the surface of the wafer to which the curable material has been applied that is performed precedently and a grinding amount when grinding the surface of the wafer to which the curable material has been applied that is performed afterwards is 100, the grinding amount when grinding the surface of the wafer to which the curable material has been applied that is performed precedently is 50 to 80, and the grinding amount when grinding the surface of the wafer to which the curable material has been applied that is performed afterwards is 20 to 50.

3. The machining process for a semiconductor wafer according to claim 1, wherein the wire saw apparatus is a slicing type using a fixed abrasive grain wire.

4. The machining process for a semiconductor wafer according to claim 1, wherein a diameter of the semiconductor wafer is 300 mm or more.

* * * * *